(12) United States Patent
Mozak et al.

(10) Patent No.: US 9,218,575 B2
(45) Date of Patent: Dec. 22, 2015

(54) PERIODIC TRAINING FOR UNMATCHED SIGNAL RECEIVER

(71) Applicant: Intel Corporation, Santa Clara, CA (US)

(72) Inventors: Christopher P. Mozak, Beaverton, OR (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/018,217

(22) Filed: Sep. 4, 2013

(65) Prior Publication Data

US 2015/0066819 A1  Mar. 5, 2015

(51) Int. Cl.
| | |
|---|---|
| G06F 3/00 | (2006.01) |
| G06F 13/00 | (2006.01) |
| G06N 99/00 | (2010.01) |
| G05B 13/02 | (2006.01) |

(52) U.S. Cl.
CPC .............. *G06N 99/005* (2013.01); *G05B 13/02* (2013.01)

(58) Field of Classification Search
None
See application file for complete search history.

(56) References Cited

U.S. PATENT DOCUMENTS

| | | | |
|---|---|---|---|
| 6,522,174 B2 | 2/2003 | Martin et al. | |
| 6,643,339 B1 * | 11/2003 | Okanoue et al. | 375/349 |
| 6,774,678 B2 | 8/2004 | Martin et al. | |
| 6,847,617 B2 | 1/2005 | Borkar et al. | |
| 6,894,536 B2 | 5/2005 | Martin et al. | |
| 7,155,006 B2 | 12/2006 | Casper et al. | |
| 7,602,056 B2 | 10/2009 | Zhao et al. | |
| 7,624,225 B2 * | 11/2009 | Gower et al. | 711/105 |
| 7,647,467 B1 | 1/2010 | Hutsell et al. | |
| 7,886,174 B2 | 2/2011 | Spry et al. | |
| 7,898,295 B1 | 3/2011 | Kasturirangan et al. | |
| 7,979,039 B2 | 7/2011 | Sumesaglam et al. | |
| 8,045,663 B2 * | 10/2011 | Bae et al. | 375/355 |
| 8,331,176 B2 | 12/2012 | Mozak et al. | |
| 8,819,474 B2 | 8/2014 | Schoenborn et al. | |
| 8,868,992 B2 | 10/2014 | Spry et al. | |
| 8,996,934 B2 | 3/2015 | Mozak et al. | |
| 9,003,246 B2 | 4/2015 | Mozak et al. | |
| 9,009,531 B2 | 4/2015 | Mozak et al. | |
| 9,009,540 B2 | 4/2015 | Mozak et al. | |

(Continued)

FOREIGN PATENT DOCUMENTS

| | | |
|---|---|---|
| KR | 10-20080043080 | 11/2009 |
| KR | 10-20080134919 | 7/2010 |

OTHER PUBLICATIONS

Mozak, Christopher P., et al., Transmittal of the International Search Report and Written Opinion in PCT Application No. PCT/US2014/052492, mailed Nov. 28, 2014, 12 pages.

*Primary Examiner* — Michael Sun
(74) *Attorney, Agent, or Firm* — Blakely, Sokoloff, Taylor & Zafman LLP

(57) ABSTRACT

I/O parameters are adjusted based on a number of errors detected in a received training signal. A controller device sends the training signal while a memory device is in a training mode. The memory device samples the training signal and the system causes an adjustment to at least one I/O parameter based on a detected number of errors. Either the controller or the memory device can perform the error detection, depending on the configuration of the system. Either an I/O parameter of the controller or an I/O parameter of the memory device can be adjusted, depending on the configuration of the system.

20 Claims, 9 Drawing Sheets

(56) References Cited

U.S. PATENT DOCUMENTS

| | | |
|---|---|---|
| 2006/0056305 A1* | 3/2006 | Oksman et al. ............... 370/252 |
| 2006/0059392 A1 | 3/2006 | Kizer et al. |
| 2007/0245177 A1* | 10/2007 | Cooper et al. ................ 714/704 |
| 2008/0130811 A1* | 6/2008 | Bae et al. ...................... 375/355 |
| 2008/0235444 A1* | 9/2008 | Gower et al. ................. 711/105 |
| 2009/0115448 A1 | 5/2009 | Abadeer et al. |
| 2009/0244997 A1 | 10/2009 | Searles et al. |
| 2010/0014567 A1* | 1/2010 | Yamamoto ................... 375/220 |
| 2010/0127736 A1 | 5/2010 | Dixit et al. |
| 2011/0110409 A1* | 5/2011 | Sands et al. ................... 375/222 |
| 2011/0141827 A1 | 6/2011 | Mozak et al. |
| 2011/0307671 A1 | 12/2011 | Fox et al. |
| 2012/0087194 A1 | 4/2012 | Oh et al. |
| 2012/0243364 A1 | 9/2012 | Hacking et al. |
| 2013/0058145 A1* | 3/2013 | Yu et al. ..................... 365/49.17 |
| 2013/0313709 A1 | 11/2013 | Hinck et al. |
| 2013/0346721 A1* | 12/2013 | Giovannini et al. .......... 711/167 |
| 2014/0184523 A1 | 7/2014 | McCall et al. |
| 2014/0189293 A1 | 7/2014 | Gopal et al. |
| 2014/0266320 A1 | 9/2014 | Conrow et al. |

* cited by examiner

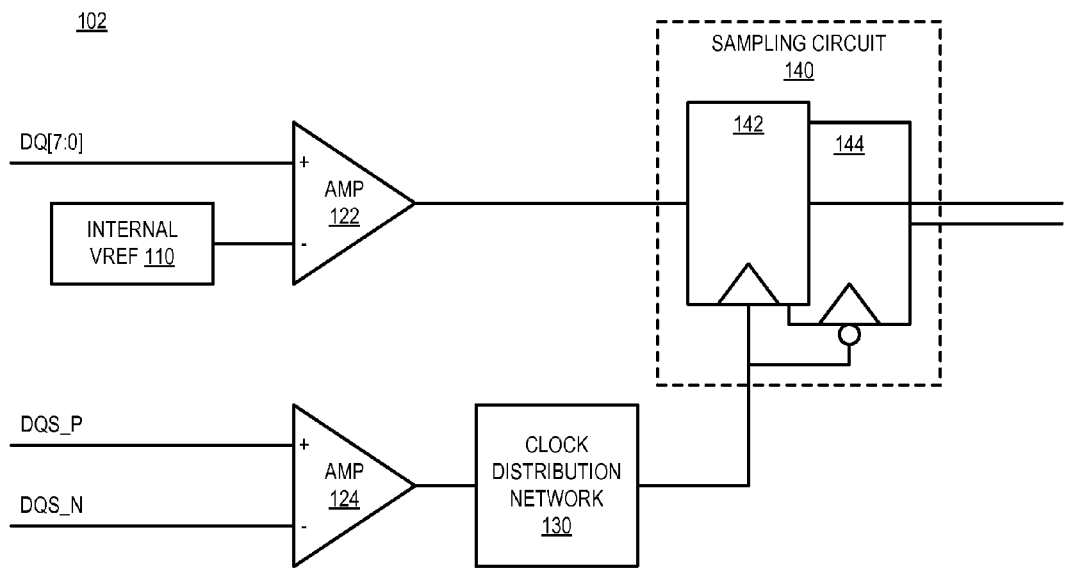
FIG. 1A – PRIOR ART
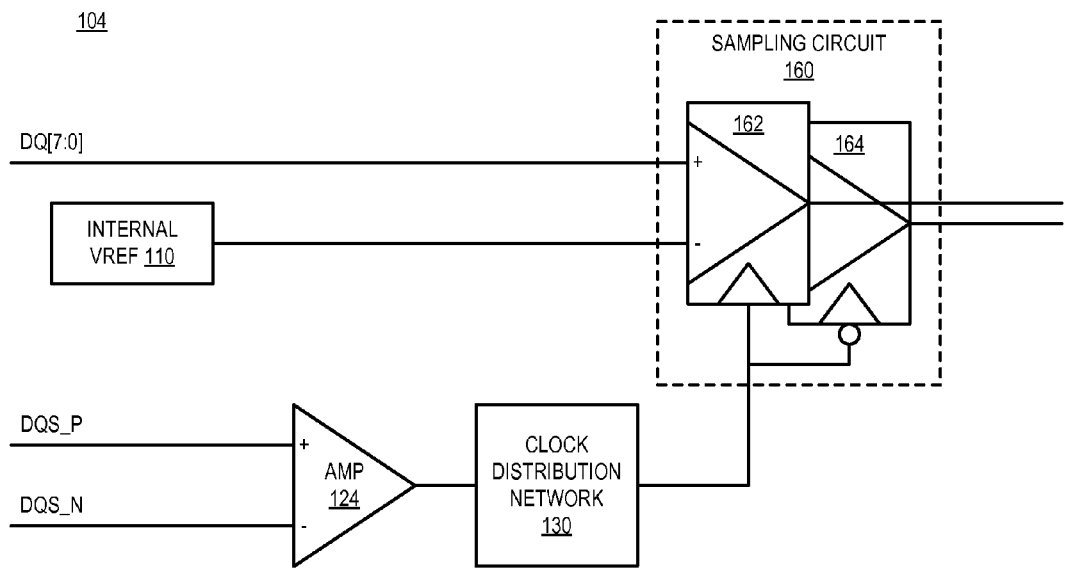
FIG. 1B – PRIOR ART

PERIODIC TRAINING FOR UNMATCHED SIGNAL RECEIVER

FIELD

Embodiments of the invention are generally related to memory device writes, and more particularly to periodic training for timing control for writes in an unmatched architecture.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2013, Intel Corporation, All Rights Reserved.

BACKGROUND

Communication between components on a host platform is necessary for operation of an electronic device. However, various conditions affect the timing of high-speed communication between components, such as temperature change and voltage variation. In general, the communication among different components can be referred to as I/O (input/output), and is frequently governed by standards (e.g., between components of a memory subsystem). The I/O standards can relate to performance characteristics for I/O power, I/O latency, and I/O frequency. The standards or nominal values of I/O performance settings are set to values that can be achieved across different systems for compatibility and interoperability. Typically, there are tradeoffs between power and latency. Thus, using tight timing parameters can reduce power, but causes the I/O latency to be more negatively affected by temperature, voltage, and process variation.

In memory subsystems, it is common to use a matched architecture, where both a data path (DQ) and a data strobe path (DQS) are amplified by matched continuous time amplifiers. FIG. 1A is a block diagram of a known matched receiver circuit. In matched architecture 102, amplifier 122 of the data path is matched to both amplifier 124 and clock distribution network 130 of the strobe path. The data path includes data input DQ[7:0] input into amplifier 122 with internal Vref signal 110. The data strobe path includes inputs for a strobe for p-type devices (DQS_P) and for a strobe for n-type devices (DQS_N). Amplifier 124 feeds into clock distribution network 130, which provides a network to distribute the clock signal to multiple recipient devices at the same time. Specifically shown is a signal going to elements 142 and 144 of sampling circuit 140.

Using an unmatched architecture can improve the receiver's power and performance as compared to using a matched architecture. FIG. 1B is a block diagram of a known unmatched receiver circuit. In unmatched architecture 104, the data (DQ) voltage is sampled directly at the pad. After being sampled, the system can amplify the signal without the tight timing constraints needed for matched architecture 102. Namely, amplification can occur over an entire UI (unit interval) or possibly more. Thus, the gain/bandwidth requirements of the unmatched receiver are lower than that of the matched receiver. As illustrated, DQ[7:0] and internal Vref 110 are fed directly to elements 162 and 164 of sampling circuit 160. The DQS path still requires a continuous time amplifier, amplifier 126, but the swing on DQS is typically larger than the swing on DQ, which means a lower gain amplifier 126 can be used, as it does not have to be matched to a high gain amplifier in the data path.

Unmatched architecture 104 improves certain receiver bandwidth and voltage sensitivities with respect to matched architecture 102, but degrades the timing control. The delay on the DQS and DQ paths are not self-compensating in unmatched architecture 104. Thus, any change in $T_{DQS}$, or the time to propagate a strobe signal through clock distribution network 130, will directly degrade the receiver timing budget. Existing training can correct the timing once, but any drift from the trained position will directly affect timing margin. Drift can occur across voltage, temperature, and/or aging, which will degrade timing margins and possibly create link failures.

Periodic training is known in which training data is written across the link (e.g., from a memory controller to a DRAM (dynamic random access memory)) and checked for errors. However, periodic training suffers from complexity and load on the bus bandwidth. Additionally, the training would be most effective if a large number of samples were averaged, but averaging more samples directly conflicts with performance requirements and feedback loop bandwidth. Furthermore, known periodic training is inherently slow because of the iterative nature of the feedback loop of existing training methods.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 1A is a block diagram of a known matched receiver circuit.

FIG. 1B is a block diagram of a known unmatched receiver circuit.

Figure 2:
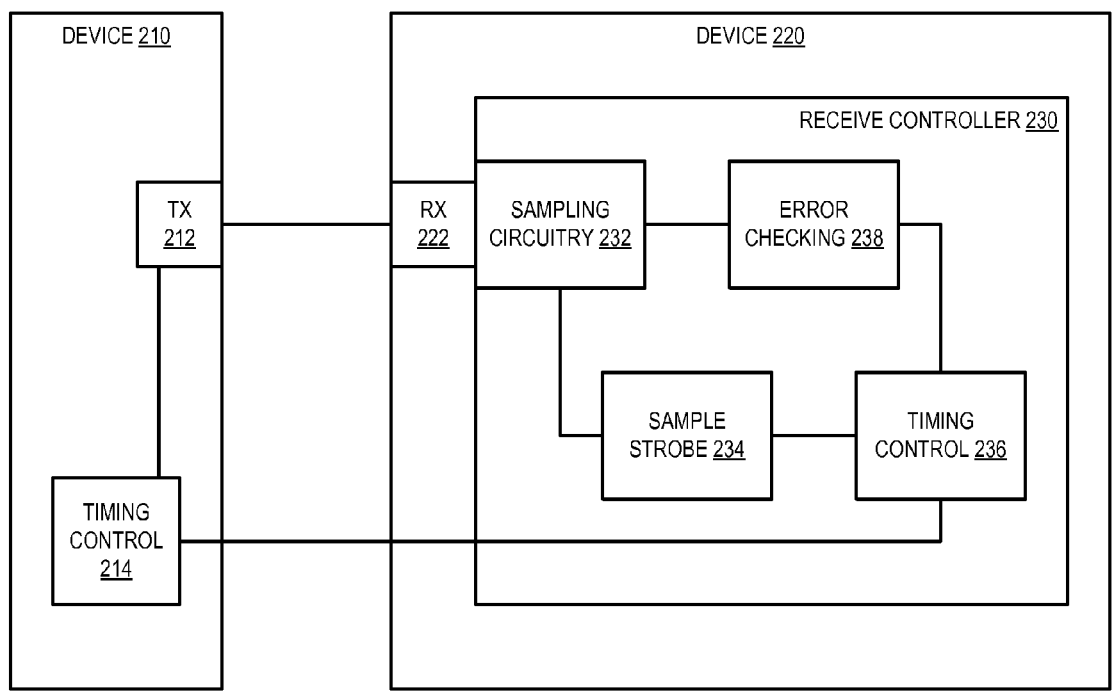
FIG. 2 is a block diagram of an embodiment of a system having an unmatched receiver circuit that performs error checking on a training signal.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, periodic training in a memory subsystem is performed during a training state or training mode. In one embodiment, the training state is during a refresh cycle of the memory device. The memory device and/or memory controller can determine when to place the memory device in the training state or training mode to reduce performance effects of the training Thus, the memory subsystem can train the I/O (input/output) during a time that will either not affect the performance of the memory device, or have a low effect on performance. For example, if the training is performed during a refresh state of the memory device, there may be no performance effect seeing that no read or write commands are issued to the memory device during refresh.

I/O parameters are adjusted based on a number of errors detected in a received training signal. A controller device sends the training signal, and the memory device samples the training signal. The controller can be a central processing unit (CPU), memory controller, or other processor in the system. The memory device can be a single device, or configured in parallel with other memory devices. Based on a number of errors detected in the received training signal, the system can adjust at least one I/O parameter. Either the controller or the memory device can perform the error detection, depending on the configuration of the system. Either an I/O parameter of the controller or an I/O parameter of the memory device can be adjusted, depending on the configuration of the system.

By tracking errors and adjusting at least one I/O parameter in response to the errors tracked, a system can periodically track drift in the timing associated with a sampling strobe signal, $T_{DQS}$, over time. Periodic compensation can allow the system to keep the sampling strobe signal (DQS) in the middle of the eye of the data signal (DQ). Periodic compensation training should be understood as supplemental and in addition to initial training or centering of the DQS signal on the DQ eye. The initial training is commonly performed via a process of a BIOS (basic input/output system) that boots and initializes the system in which the memory device and controller are located. Thus, the initial training can be assumed to be completed, and the periodic compensation training can track and compensate for drift in $T_{DQS}$. Drift typically occurs due to changes in environmental conditions, such as temperature and/or voltage changes during operation of the system. Additionally, aging of the device can cause changes in performance of the device.

When the periodic training is used to determine drift, instead of performing initialization training, the system can use a simple training pattern (e.g., 1010) for the periodic training A simple training pattern should be sufficient to identify drift in the strobe signal relative to the data signal. In one embodiment, the controller or transmitting device controls the training operations. The controller can separately track values that provide information on the data signal. In one embodiment, the system employs phase interpolation to sub-divide the activity happening during each phase of the system clock. These values provide information about the specific location of the data signal and/or the strobe signal within the clock cycle. The logic used to track the phases can be referred to as a phase interpolator (PI), and values derived from the logic can be referred to as PI values. Typical subdivisions can be 8, 16, or 32, but other binary values can be used.

In one embodiment, the controller separately tracks two PI values. One PI indicates conditions for normal operation, and represents the eye center for a worst case training pattern (e.g., as determined during initialization training) A second PI value indicates conditions with respect to the periodic training used to track an eye edge. During periodic training, the control logic (e.g., at the controller, memory device, or some combination) can detect how much the DQ edge moves relative to a previously stored value. Based on how much the edge moved, the control logic can determine how to offset the DQ center value. If the DQ edge is based on the training pattern, it should accurately capture the average DQ movements. This is true even if a simple training pattern is used, as it should also indicate the average movement with respect to a more complex pattern on the data bus (e.g., more complex patterns such as random, LFSR (linear shift feedback register), Victim Aggressor, Even vs. Oddmode, etc.).

By tracking the eye edge drift or movement over time of the data eye with periodic training, the system can monitor the write path of an I/O interface from a controller to a memory device. The monitoring can provide details on the performance of the I/O interface. When provided during refresh or some other special training period when the I/O interface is otherwise idle, the system can generate enough samples to average to filter noise in the errors, with minimal impact to effective bus bandwidth.

In one embodiment, a test system or test engine can be used to test memory subsystems, and more specifically, the I/O (input/output) interface or communication between a platform component (e.g., a processor, a memory controller) and a memory device. The testing can implement the periodic testing described. Any memory subsystem that uses a memory controller with a scheduler or equivalent logic can implement at least one embodiment of a test engine. Reference made herein to memory devices can include different memory types. For example, memory subsystems commonly use DRAM, which is one example of a memory device as described herein. Thus, the test engine described herein is compatible with any of a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR4 (low power dual data rate version 4, specification in development by JEDEC as of the filing of this application), WIO (Wide I/O, specification in development by JEDEC as of the filing of this application), and/or others, and technologies based on derivatives or extensions of such specifications.

In one embodiment, operation of an I/O interface circuit can be further controlled via the use of empirical testing. Based on changes in delay detected by periodic training, a system can empirically test performance parameters of device I/O (input/output) to determine what parameter(s) to modify to adjust for the detected timing changes. Based on the empirical testing via a test system, the system can set the performance parameters specific to the system or device in which the inter-device communication takes place. For each of multiple different settings for multiple different I/O circuit parameters, the test system can set a value for each I/O circuit parameter, generate test traffic to stress test the communication with the parameter value(s), and measure an operating margin for the I/O performance characteristic. The test system can further execute a search function to determine values for each I/O circuit parameter at which the delay is compensated. In one embodiment, the system sets runtime values for the I/O circuit parameters based on the search function. The settings can be dynamically changed for specific components of specific systems based on testing.

As stated above, unmatched architectures can provide significant improvements in bandwidth and frequency with respect to a matched architecture. However, traditional unmatched architectures suffer from degraded timing control. As described in more detail below, a system can manage timing control for an unmatched receiver architecture through use of periodic training The system detects errors in reception of a training signal and determines one or more I/O parameters to adjust between the memory controller and/or the memory device to compensate for timing drift indicated by the error detection.

In one embodiment, the receiver circuit provides information back to a transmitter to cause the transmitter to adjust its operation based on the detected errors. Thus, delay changes can be compensated by changing the transmit behavior of the transmitter device. In one embodiment, the receiver device can compute the I/O adjustment needed. In one embodiment, the receiver device simply sends raw data to the transmitter, which can then compute an I/O adjustment based on the detected changes.

FIG. 2 is a block diagram of an embodiment of a system having an unmatched receiver circuit that performs error checking on a training signal. System 200 includes device 210, which is shown with transmitting hardware TX 212, and device 220, which is shown with receiving hardware 222. It will be understood that in one embodiment device 220 could also send a transmission to device 210; thus device 220 can include transmitting hardware that is not explicitly shown, and device 210 can include receiving hardware that is not explicitly shown. In one embodiment, the transmitting and receiving hardware is transceiver hardware, which allows interfacing by both transmitting and receiving. The devices are connected via one or more transmission lines, which are driven by a transmit driver. The transmission line can be any type of signal line (e.g., trace, wire) connecting I/O pins of device 210 with device 220.

Device 220 includes receive controller 230, which represents hardware and other logic that performs the receiving operations for device 220. Receive controller 230 can include sampling circuitry 232 to sample the voltage levels of the received signal from RX 222. Sampling circuitry 232 is controlled by sample strobe 234 or other control signal, which indicates when to sample the incoming or received signal. Sample strobe 234 is generated as a separate signal by receive controller 230. Receive controller 230 includes timing control 236 to control the generation of sample strobe 234.

In one embodiment, receive controller 230 includes error checking 238, which includes hardware and/or other logic to determine if errors are detected in a received training signal. Drift (either positive or negative) in the timing of sample strobe 234 with respect to a data eye in the signal received by RX 222 can negatively affect the ability of device 230 to successful receive the incoming signal. Error checking 238 can determine if the sampling strobe is aligned with the data signal. If a threshold number of errors are received over a number of samples, the system can determine that drift has occurred in the receiver timing. Based on the drift, or the change in delay of the strobe signal or control signal with respect to the data signal, timing control 236 can adjust for the change. In one embodiment, timing control 236 and/or other control logic adjusts for delay by signaling device 210 to change its transmit parameters to better match the sampling timing of sampling circuitry 232. Thus, timing control 214 of device 210 can adjust operation of TX 212. In one embodiment, timing control 236 adjusts the timing of strobe sample 234 to adjust the timing of sampling circuitry 232. Thus, system 200 controls the timing of the receive circuitry of device 220 with respect to the transmit circuitry of device 210.

In one embodiment, error checking 238 generates an error count that is sent directly to control logic (timing control 214 and/or other logic) of device 210. Thus, timing control 214 and/or other control logic of device 210 can adjust the operation of device 210 and/or device 220 to compensate for drift. It will be understood that timing control 214 and/or timing control 236 could alternatively be labeled as I/O control, indicating that they include logic that adjusts the I/O performance of the devices. The I/O performance adjustment changes the timing of the I/O interface.

Assuming as one example that device 210 is a memory controller or processor and device 220 is a memory device, it could be said that system 200 relates to how to measure tDQS delay (the propagation delay of the data strobe signal), and adjust the controller/processor transmitter timing to compensate for changes in the delay. By tracking errors during a refresh or training mode of the memory device, the I/O interface can be used to exchange a training signal without affecting throughput bandwidth of the I/O interface.

It will be understood that the circuit path of sample strobe 234 is not matched to sampling circuitry 232. Thus, receive controller 230 employs an unmatched receiver circuit architecture. Unmatched architectures are typically sensitive to voltage and temperature changes, so the behavior of the circuit (and specifically the timing) changes over time. However, monitoring the change in timing with period training, as indicated by error checking 238, allows system 200 to adjust the I/O interface timing, which in turn adjusts the sampling point. Otherwise, the sampling point would drift causing sampling at the wrong part of the signal and result in receive errors.

It will be understood that the periodic training simply tracks edge movement in the I/O interface, rather than testing the I/O interface performance with respect to worst-case scenario or worst-case pattern. Thus, the training may not be considered 'robust,' because the training simply determines how much change occurs relative to previously stored values. The changes in number of errors detected should indicate movement of the edges of the data signal with respect to the strobe signal. In one embodiment, the memory device performs the error checking, which allows the testing to be done with fewer reads than writes. For example, the memory device can be configured to ignore or drop a write received during a training mode. Thus, the training can complete much more quickly with respect to having to perform a read for every write as with traditional periodic testing.

A real read requires a save and a restore, as well as requiring active operation of the memory device, which interferes with real access bandwidth. In a training mode, the memory device can simply receive and sample the incoming signal, and then drop it instead of writing it to physical media. In an alternative embodiment, the memory device can write the incoming signal to a register or register(s) used in training mode for the training signal, and again, not write the data to the physical storage media array. Even in the case where the controller reads the register(s) to detect errors in the training signal, the save and restore is not required.

It will be understood that the periodic training would preferentially be performed with a sufficient number of training signal samples to allow for averaging the number of errors detected. For example, a spurious condition during a single training signal sample could lead to incorrect results. However, monitoring the number of errors detected, on average, over 100 training signals can produce a more accurate reading of the number of errors. For example, a large number of training signals (e.g., 50 or 100), could be performed during a refresh cycle of the memory device without affecting the overall performance of the memory device.

In one embodiment, PI values or other error tracking values can be stored in a register and monitored with respect to subsequent trainings Control logic can move the data signal edge right or left based on the results of the change in the currently read error tracking value with respect to a previous value. In one embodiment, the system performs a search, as described below, to determine how to alter performance of the I/O interface to change the data edge.

In one embodiment, system 200 uses the error measurements as input to perform a search that specifically determines settings for the runtime system to improve I/O. Based on the detected errors, and possibly other measured I/O parameters, search logic (which may be part of test logic, or may be separate logic) determines from measured values what settings to use for I/O between the devices. In one embodiment, the search logic can use the measurements to generate one or more representative performance curves for I/O. Based on the representative curves, the search logic can perform a search function to determine what settings to use to satisfy better performance for at least one parameter, while at least maintaining required (by standard or configuration) performance for the others. The search logic can include any of n-dimensional search logic, 1-dimensional search logic (to perform n 1-dimensional searches), linear fit search logic, quadratic fit search logic, steepest descent search logic, curve fitting search logic, or others. It will be understood that n represents an integer indicating the number of combinations to search. In one embodiment, the search logic can also combine multiple measurements together to either reduce repeatability noise or extrapolate to worst case conditions. Thus, control logic can determine to cause an adjustment to a receive I/O parameter of the memory device, and/or a transmit I/O parameter of the controller.

Figure 3:
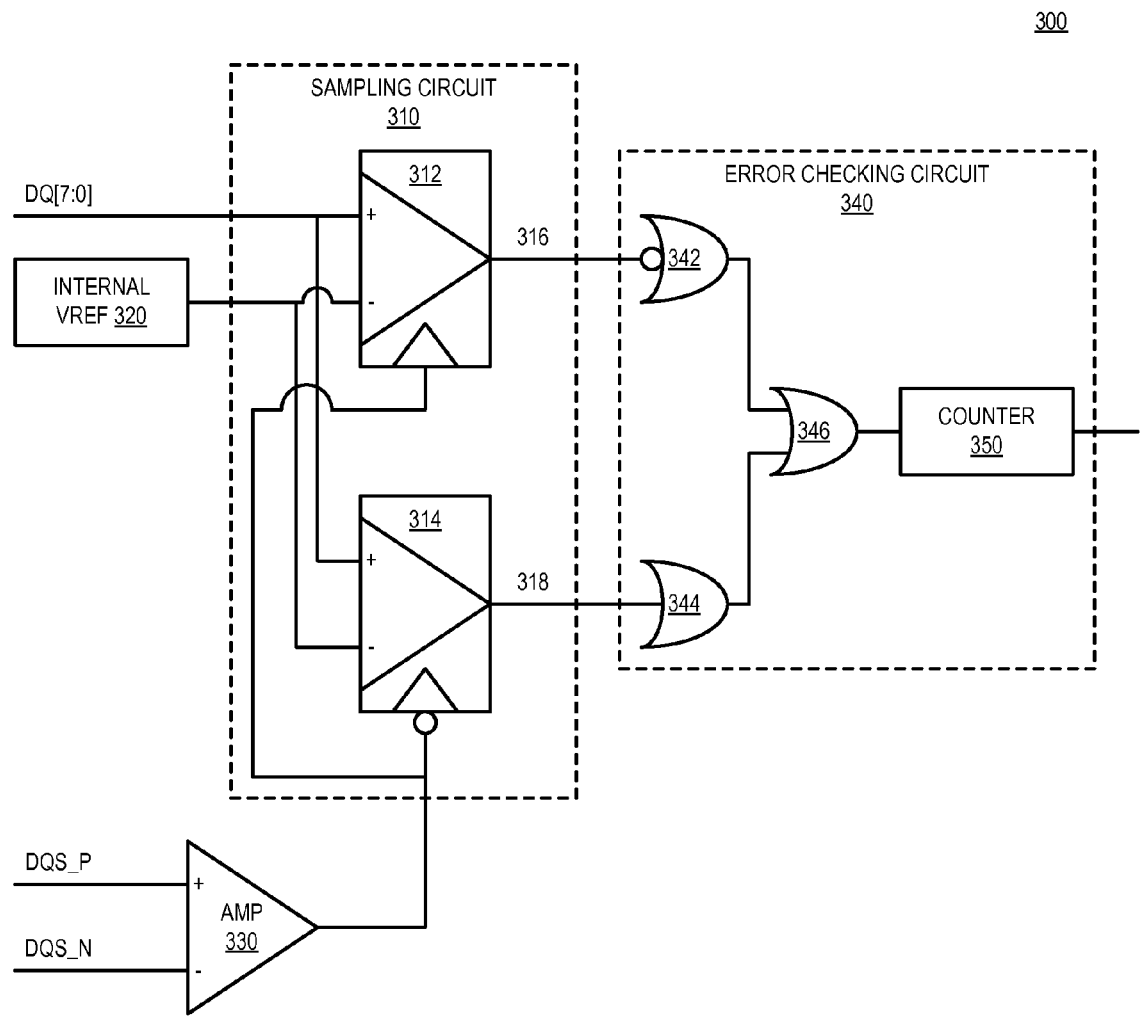
FIG. 3 is a block diagram of an embodiment of a system having an unmatched receiver circuit and error checking circuit that counts errors in a received training signal.

FIG. 3 is a block diagram of an embodiment of a system having an unmatched receiver circuit and error checking circuit that counts errors in a received training signal. Circuit 300 provides one example of sampling circuitry and error checking, such as illustrated in system 200 of FIG. 2. In one embodiment, a memory device of which circuit 300 is a part enters a training mode to perform the training or I/O interface testing. In one embodiment, the memory device can enter the training mode while an all bank refresh is occurring in the memory device. Thus, the training can occur approximately every 7.6 uS without consuming I/O bandwidth and impacting performance. It will be understood that training could be performed more frequently, but increased frequency would result in performing training at times other than during refresh, which can negatively impact available I/O bandwidth for memory access operations. It will be understood that performing training at times other than during a refresh can be computed to be during a time of lower load on memory device access, which can reduce the performance effects of the training Circuit 300 is an unmatched receiver circuit, including sampling circuit 310, and unmatched amplifier 330. Amplifier 330 is connected to sampling circuit 310 by a clock distribution network, which has been eliminated for purposes of simplicity. However, the difference between the delay through the clock distribution network and the delay of sampling the received data signal DQ[7:0] is what identifies circuit 300 as an unmatched receiver. The change in the delay through the distribution network can cause the drift in the sampling signal as compared to the data signal.

Sampling circuit 310 samples received data signal DQ[7:0] against an internal reference voltage Vref 320. It will be understood that the data signal can be more of fewer than 8 bits, depending on the configuration of the system in which circuit 300 is a part. Sampling circuit 310 includes element 312 to provide a sample of the input signal on the positive sample strobe, and element 314 to provide a sample of the input signal on the complementary portion of the sample strobe. Other configurations are possible. Elements 312 and 314 are sampling amplifiers, which sample the actual received signal, and amplify the sample. Thus, the amplification can be performed by a lower speed amplifier as compared to amplifying prior to sampling, as with a matched configuration.

Amplifier 330 receives as inputs a pull-up strobe signal and a pull-down strobe signal. The clock distribution network distributes the strobe or sample signal to multiple different elements, for example, multiple different sampling elements (not shown). The exact number of levels of the distribution network will vary by implementation. Common distribution networks include binary tree (each additional level includes two branches) and H-tree (each additional level includes four branches and looks like an "H") distribution networks. The delay from amplifier 330 to sampling elements 312 and 314 changes over time based on operation of the device, through aging, changing voltage levels, changes in temperature, or possibly other operating conditions.

In one embodiment, sampling elements 312 and 314 are fed into error checking circuit 340, a simplified version of which is illustrated in FIG. 3. In one embodiment, error checking circuit includes inverting gate 342 to receive sample 316 from element 312, sampled at the positive portion of the sample strobe, and noninverting gate 344 to receive sample 318 from element 314, samples at the negative portion of the sample strobe. It will be understood that for a training signal of 1010. . ., output sample 316 should always be a '1', and output sample 318 should always be a '0'. Thus, the outputs of gates 342 and 344 can be provided as input to XOR gate 346, which should only generate a 1 if there is an error in the received signal. When the received signal is received correctly, gate 346 will always output a zero.

Counter 350 counts the number of errors detected in the received training signal. In one embodiment, the sampled incoming training signal is received at error checking circuit 340, but discarded instead of being written to a memory array of the memory device in which circuit 300 is a part. In one embodiment, counter 350 counts the number of errors detected over a sequence of training signals. Thus, the final count of counter 350 will represent a cumulative value. In one embodiment, the output of counter 350 is sent to control logic in the memory device, which determines what I/O performance parameters to adjust in response to the number of errors detected. Based on the number of errors detected, the control logic may determine not to adjust any parameters for a particular training sequence. In one embodiment, the output of counter 350 is sent to control logic in a controller device, which can then determine what I/O performance parameters to adjust in response to the number of errors detected. Either control logic can include search logic to make the determination.

Figure 4:
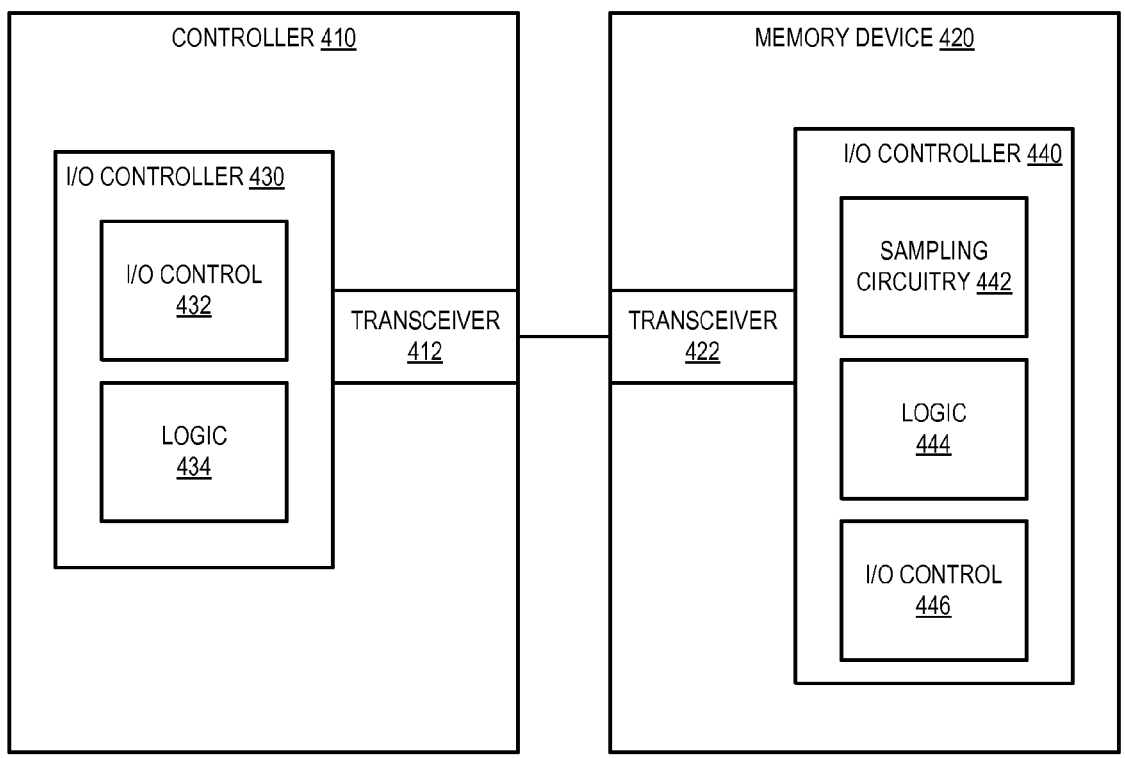
FIG. 4 is a block diagram of an embodiment of a system that adjusts I/O operation based on detection of errors in a training signal sent from a transmitter to a receiver.

FIG. 4 is a block diagram of an embodiment of a system that adjusts I/O operation based on detection of errors in a training signal sent from a transmitter to a receiver. System 400 can be one example of a system in accordance with system 200 of FIG. 2. Controller device 410 is the transmitting device, and memory device 420 is the receiving device for purposes of exchange of a training signal or signals to test the I/O interface between the two devices. As illustrated, memory device 420 can also communicate back to controller 410, although such communication would not include sending an I/O interface training signal to test the I/O interface. Memory device 420 can communicate data back to controller, such as sending a counter value for determination of how to adjust I/O performance parameters, or sending data in response to a read command by the controller (which could include a read of the training signal stored in a training register).

Controller 410 includes transceiver 412 to interface with memory device 420. Memory device 420 includes transceiver 422 to interface with controller 410. The connection between the two transceivers is the I/O interface. The I/O interface can be understood as including I/O controller 420 of controller 410 and I/O controller 440 of memory device 420. I/O controller 420 allows controller 410 to set parameters of transmission and/or reception for transceiver 412. Similarly, I/O controller 440 enables memory device 420 to set parameters of reception and/or transmission for transceiver 422.

In one embodiment, I/O controller 430 includes I/O control 432, which can include registers, tables, and/or other mechanisms that store values associated with I/O via transceiver 412. I/O control 432 controls the settings used by transceiver 412 for physical parameters of communication and/or latency parameters. Logic 434 represents control logic at controller device 410, which can enable the controller device to determine what parameter or parameters should be adjusted to compensate for drift as indicated by periodic training In one embodiment, I/O controller 440 includes I/O control 446, which can be similar to I/O control 432. Thus, I/O controller 440 can include registers, tables, and/or other mechanisms that store values associated with I/O via transceiver 422. In one embodiment, I/O control 446 includes a register or registers used by memory device 420 to temporarily store a training signal for a read by controller device 410, without having to write the signal to the memory array (memory array not shown). Logic 444 represents control logic at memory controller 420, which can determine what parameter or parameters to adjust to compensate for drift as indicated by periodic training I/O controller 440 can include sampling circuitry 442 to sample the receive signals. In one embodiment, sampling circuitry 442 can include error detection circuitry to count a number of errors in a sequence of training samples.

As illustrated in system 400, in one embodiment, memory device 420 can be configured to check errors in the training signal. In one embodiment, controller device 410 can be configured to check errors in the training signal. Memory device 420 can check errors by using error checking circuitry. The memory device can then cause an adjustment based on the errors detected and/or indicate the detected errors to controller device 410 to have the controller cause an adjustment based on the errors detected.

Controller device 410 can check errors by the controller issuing read commands to read back the training data sent. An example command test flow could be: Write Data0, Read Data0, Write Data1, Read Data1, . . . , where Data0, Data1, . . . are potentially different data values driven on the bus. For the controller device to check for errors, memory device 420 can be configured to store the training data in a buffer (e.g., a new or existing register or other buffer) between the write and read commands without writing the data to the memory array. When controller device 410 checks for errors, the periodic training could more easily test different data patterns. However, error checking by the controller device would be expected to take longer than error checking by the memory device.

In one embodiment, controller device 410 includes a finite state machine (FSM, not explicitly shown) that controls the periodic training For example, the FSM can be configured to enable a training mode every N refresh commands, where N is some integer. The training could occur every refresh cycle, or less frequently. The FSM could alternatively be configured to perform training during a relatively low load time of the memory device after a timer reaches a threshold time. The controller device can monitor a known value representing the edge of the data eye, and issue M writes to generate the training signal. The error detection can monitor the edge (e.g., the setup timing) as opposed to both setup and hold edges, if only the edge of the data eye is monitored (as opposed to the whole eye). After issuing the write commands, the controller device can read back the error count and/or read back the written data, and determine if the data edge should be incremented or decremented. In one embodiment, the FSM can move the data eye edge one or more ticks (or subdivided portions, as done with phase interpolation). The FSM can run the test to determine which direction to move the edge of the eye.

In one embodiment, control logic of controller device 410 (if the controller device causes error adjustments) or control logic of memory device 420 (if the memory device causes error adjustments) can offset settings associated with the center of the data eye, in response to changes detected in the edge of the eye. Thus, the periodic training can monitor an edge of the eye, and move a center of the eye commensurate with a change or movement detected in the edge of the eye. The centering of the eye could be done on a channel, word, byte, or bit basis as required. It will be understood that the amount of the feedback from the memory device to the controller device may need to be increased depending on how the centering is performed. In one embodiment, memory device 420 includes multiple ranks. In one embodiment, error detection can be performed on a rank by rank basis. In an alternative embodiment, error detection can be performed on a selected rank, and applied across all ranks. Specific implementation details will be based on environmental constraints such as how much difference in temperature or voltage is expected to exist across different ranks.

It will be understood that the periodic training can be understood as a digital feedback loop. Digital feedback loops typically dither between two adjacent settings. In one embodiment, the value of a PI edge setting can dither between two adjacent settings, but the dithering can be filtered out of a PI center setting using known digital filtering techniques. For example, the PI center setting could move only after the PI edge setting moves twice in the same direction (e.g., the center PI always lags the edge movement by one setting). Assuming the PI edge setting only dithers by one setting value, such a filter can eliminate the feedback dithering as a source of noise.

Based on a mode of operation of the memory device and/or training time constraints, the control logic that determines how to adjust I/O parameter setting(s) to compensate for drift can collect more or less data, and/or search more settings or parameters. The logic can make the tradeoff between more of less data, and more search time or less search time based on prior drift results, power state activity, temperature changes, and/or other environmental changes in the system. For example, frequent fluctuation in temperature/voltage, or high variance in prior drift results can indicate that more settings can be used, and/or that a results search can used more processing to achieve a more accurate result. Very little variance can indicate the opposite.

Figure 5:
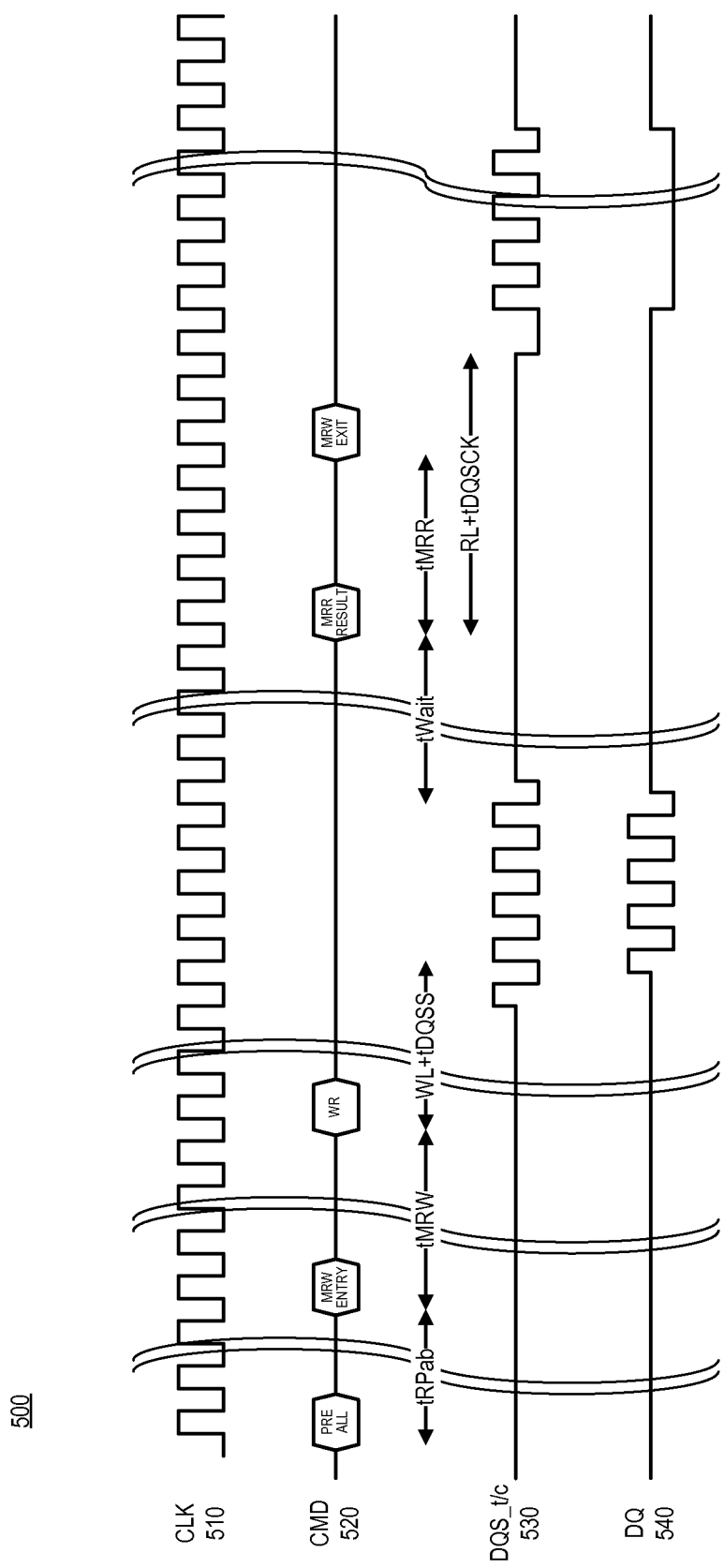
FIG. 5 is a timing diagram of an embodiment of operation timing for detecting errors in a received training signal.

FIG. 5 is a timing diagram of an embodiment of operation timing for detecting errors in a received training signal. Timing diagram 500 illustrates one embodiment of a flow of commands to a DRAM device, which can be one example of a memory device in accordance with any embodiment described. Clock signal 510 is the system clock. CMD 520 is the DRAM command signal sent by a memory controller, which can be one example of a controller device in accordance with any embodiment described. PRE ALL represents an initial state of the system for purposes of the training. There is a delay of tRPab between PRE ALL and the issuance of the MRW Entry command. MRW (mode register write) Entry represents a command to enter a special training state.

The training state is a special mode that can be enabled using an MRW, an explicit command, or some similar mechanism. After waiting an appropriate time for the DRAM to enter the training state, tMRW, the host or memory controller can issue normal Write command(s) to the DRAM. In one embodiment, the write command and MRW are the same command. In one embodiment, the DRAM treats the writes differently when received in the training state versus when writes are received not in the training state. For example, the DRAM can check that the write data matches the desired training pattern without accessing the internal memory array. There is a delay of WL+tDQSS (a write latency) between the command showing up on command signal 520 and the data strobe signal being generated (DQS_t/c 530). After the strobe signal begins, the data is received on the data line, DQ 540. The amount of data on the line will depend on how many writes are generated by the memory controller for training In one embodiment, DRAM error checking is very simple when a training pattern of 1010 is used. For example, with a 1010 training pattern, the checking logic can require that all rising DQS samples be 1 and all falling DQS samples be 0. The DRAM can check if any lane in a byte experienced an error for each cycle. In one embodiment, if one or more errors are detected in a given cycle, the DRAM increments an error counter by one. In one embodiment, each DQ byte has a separate N-bit counter in the DRAM to count errors. The count of the counter can provide a much more accurate view of the average relative positions of DQS as compared to DQ, which allows control logic to filter noise from a few bad samples, reducing noise and training time.

In one embodiment, DRAM combines error counts from different lanes and DQS edges before the counter, which makes sure that the training focuses on the worst case lane/edge. After waiting a delay (tWait) after the final write DQS edge, the memory controller can issue a MRR command or similar command to read the error results. As illustrated, an MRR result command is issued to the DRAM. After a time of tMRR (the time to generate the read command), the memory controller can issue an MRW exit command, and/or the memory device can exit the training state. After a delay of RL+tDQSCK (a real latency), the memory controller reads the error counter results. It will be understood that a similar flow could be generated for a case in which a memory controller reads back the training data to check for errors at the controller instead of the DRAM. In one embodiment, the error count can be automatically reset to 0 by the MRW training mode enter command. In one embodiment, the memory controller could also reissue a MRW training mode command, even if the DRAM is already in the training state or training mode, for the purposes of resetting the counter.

Figure 6A:
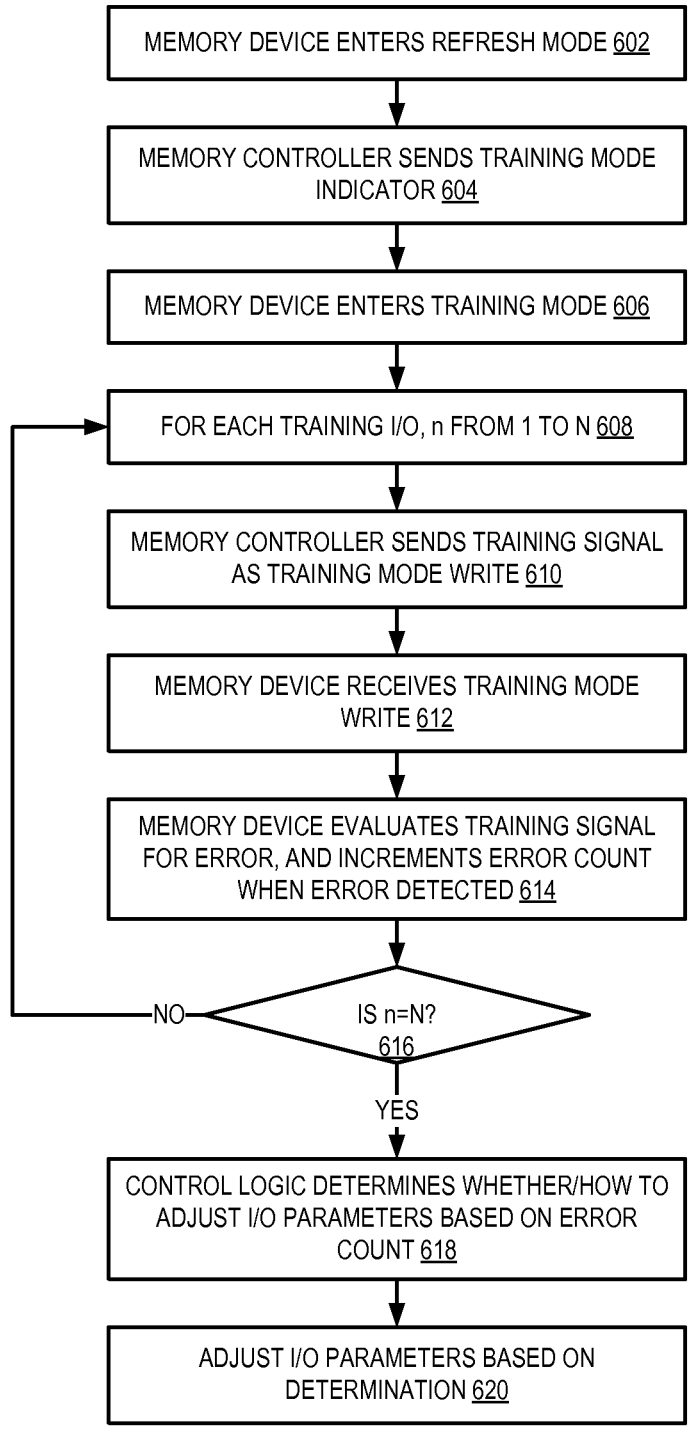
FIG. 6A is a flow diagram of an embodiment of a process for checking for errors in a received training signal, with error checking performed by the receiving device.

FIG. 6A is a flow diagram of an embodiment of a process for checking for errors in a received training signal, with error checking performed by the receiving device. In one embodiment, a memory device enters a refresh mode, 602. For example, a memory controller can send a command to the memory device to cause the memory device to enter the refresh mode. In refresh, the memory device typically cannot receive and process commands from the memory controller, because access to the memory array is not permitted. Alternatively, a memory controller can send a command at a time other than during refresh.

In one embodiment, the memory controller sends a training mode indicator to the memory device, 604. The training mode indicator could be a command sent by the memory controller. The training mode indicator could be a register setting of the memory device that the memory controller sets. In response to the training mode indicator, the memory device enters the training mode, 606. In the training mode, the memory device can receive certain training commands over the command bus, and process the commands, while not accessing the memory array.

While in the training mode, the memory controller can send I/O for processing by the memory controller. The training I/O is normal I/O from the perspective of the I/O interface. However, from the perspective of access to the memory array, the training I/O is a "dummy" I/O, meaning the I/O does not generate an access to the memory array. For each training I/O, from n=1 to N, 608, a training signal or sequence of training signals is sent from the memory controller to the memory device, 610. In one embodiment, the memory controller sends the training signal as a training mode write. The training mode write can be a normal write command send while the memory device is in the training mode, or can be a write command specific to training The memory device receives the training mode write, 612. The memory device treats the training mode writes differently than typical write commands in that the memory device receive processor does not forward the data for access to the memory array media. In one embodiment, the memory device evaluates the training signal for errors, and increments an error count when an error is detected, 614.

As long as n is not equal to N, or the number of training signal to be received and processed during the training state, 616 NO branch, the memory controller continues to send training signals for processing by the memory device, 608 through 614. When n is equal to N, control logic determines whether and/or how to adjust one or more I/O parameters based on the final error count, 618. In one embodiment, the control logic uses a search function to evaluate I/O parameters. In one embodiment, the control logic is part of the memory device. In one embodiment, the control logic is part of the memory controller. In one embodiment, the control logic determines to adjust an I/O parameter related to transmission by the memory controller. In one embodiment, the control logic determines to adjust an I/O parameter related to receiving the signal by the memory device. The system adjusts the determined I/O parameter(s) in accordance with the determination, 620.

Figure 6B:
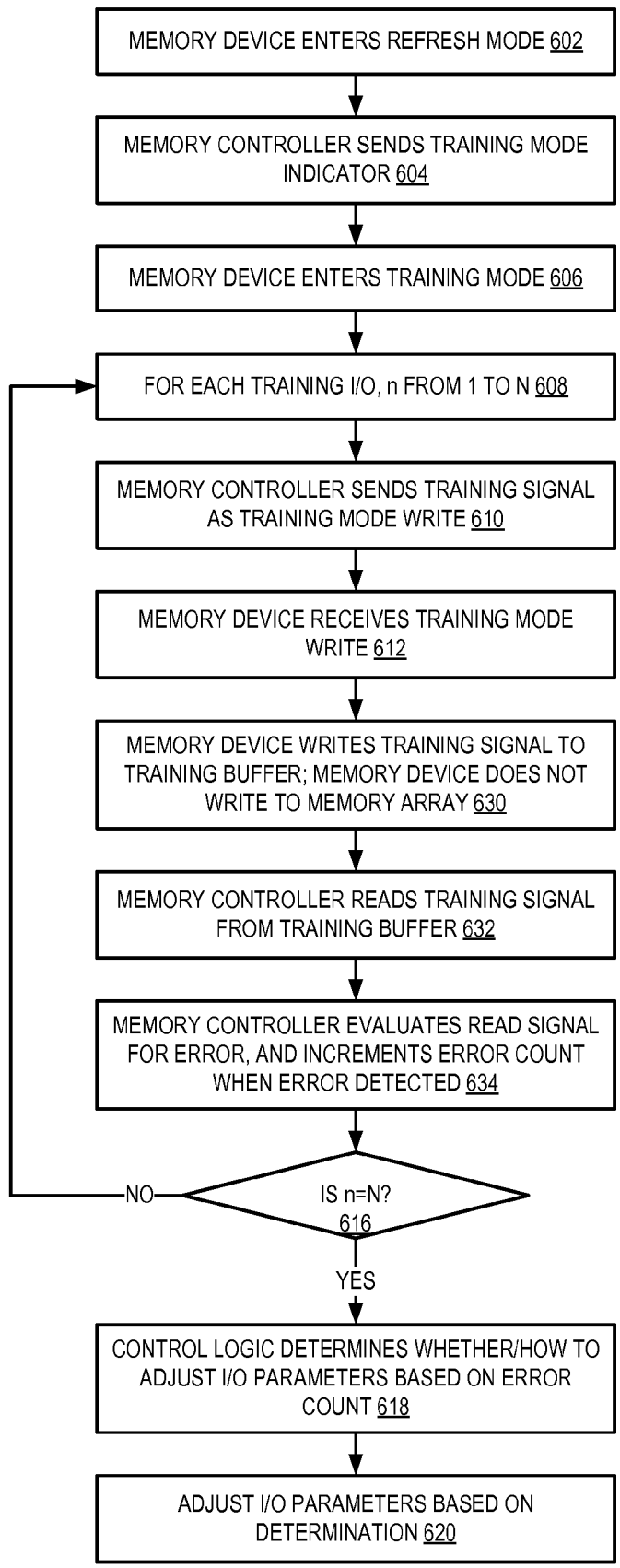
FIG. 6B is a flow diagram of an embodiment of a process for checking for errors in a received training signal, with error checking performed by the transmitting device.

FIG. 6B is a flow diagram of an embodiment of a process for checking for errors in a received training signal, with error checking performed by the transmitting device. It will be observed that FIG. 6B differs from FIG. 6A at 630, 632, and 634. Otherwise, the flow of operations is similar or the same as what is stated above. Rather than repeating what is stated above, the description of FIG. 6B will focus on the portions that are different.

Whereas in FIG. 6A, once the memory device receives the training mode write, 612, the memory device evaluated the training signal for error, in FIG. 6B, the memory controller evaluates the training signal for error as follows. The memory device receives the training mode write, 612, and the memory device writes the training signal to a training buffer, but the memory device does not write to the memory array, 630. The memory controller reads the training signal from the training buffer in a subsequent operation, 632. For example, the memory controller can issue a training buffer read command. The training buffer can be an existing register or buffer of the memory device, which the memory controller can access through a register read command, for example. Then the memory controller evaluates the read signal for errors, and increments an error count when an error is detected, 634. Again, the process continues for all I/O to be sent by the memory controller to the memory device for the training sequence. As before, control logic at the memory controller or at the memory device determines whether and/or how to adjust one or more I/O parameters based on the error count.

Figure 7:
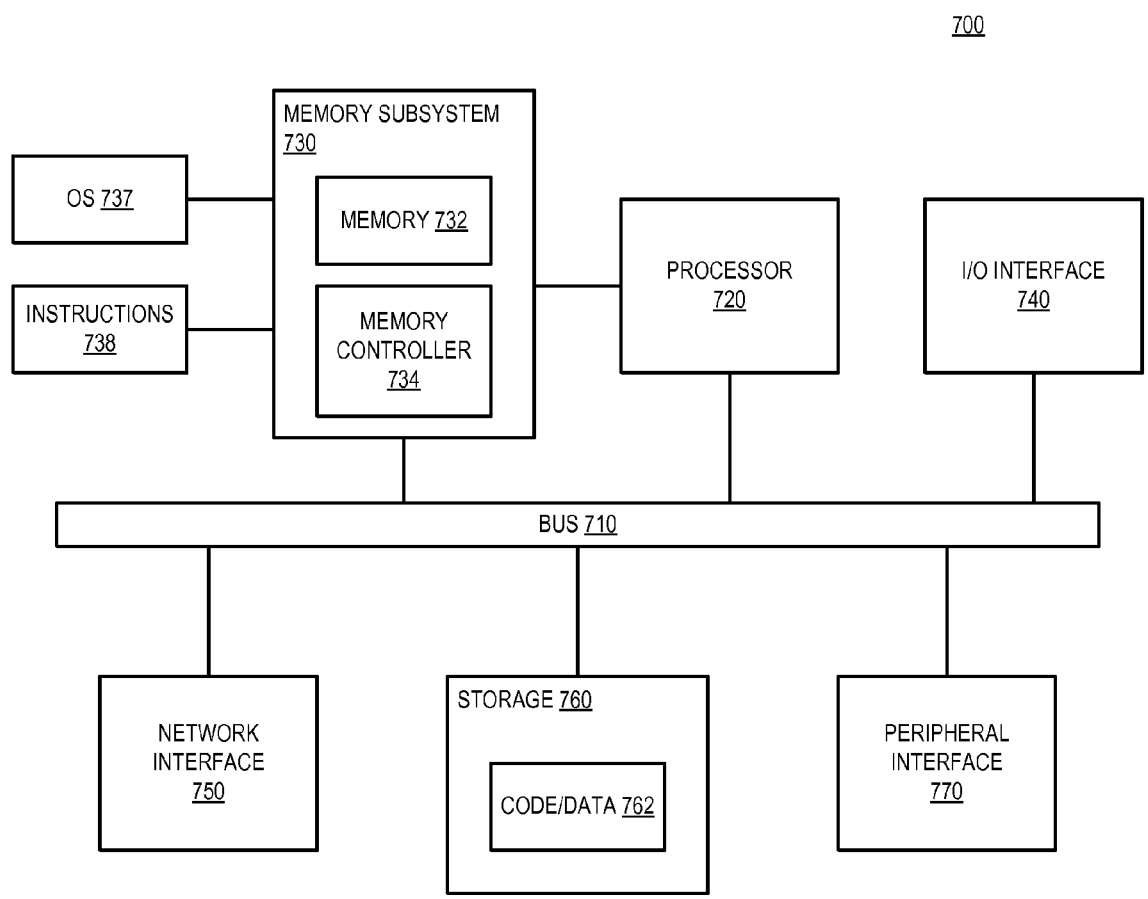
FIG. 7 is a block diagram of an embodiment of a computing system in which receive signal error checking can be implemented.

FIG. 7 is a block diagram of an embodiment of a computing system in which receive signal error checking can be implemented. System 700 represents a computing device in accordance with any embodiment described herein, and can be a laptop computer, a desktop computer, a server, a gaming or entertainment control system, a scanner, copier, printer, routing or switching device, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 includes memory device 732 where it stores data, instructions, programs, or other items. In one embodiment, memory subsystem includes memory controller 734, which is a memory controller in accordance with any embodiment described herein, and which includes a scheduler to generate and issue commands to memory device 732.

In one embodiment, memory subsystem 730 and memory device 732 implement I/O timing compensation based on feedback generated via periodic training Memory device 732 enters a training state, and memory controller 734 sends a training signal via the I/O interface between the memory device and the memory controller, which the memory device does not store in its memory array. In one embodiment, memory device 732 evaluates the received training signal for errors. In one embodiment, memory device 732 stores the training signal in a training buffer, which can be any buffer used to store the training signal, and memory controller 734 reads the buffered training signal, and evaluates the signal for errors. Based on detected errors, the system adjusts one or more I/O parameters of either the memory controller or the memory device or both to compensate for changes in environmental conditions that affect I/O timing.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

Figure 8:
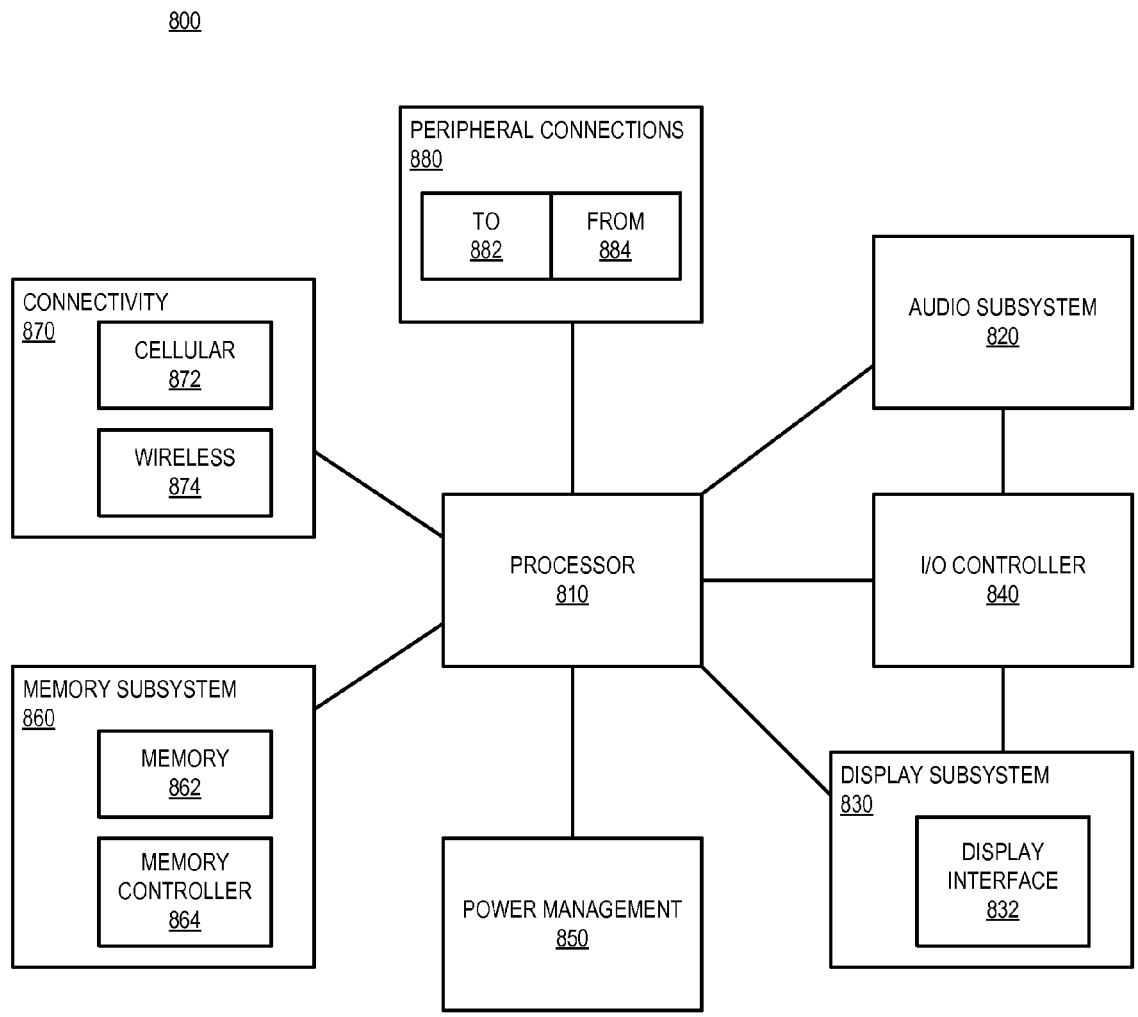
FIG. 8 is a block diagram of an embodiment of a mobile device in which receive signal error checking can be implemented.

FIG. 8 is a block diagram of an embodiment of a mobile device in which receive signal error checking can be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. In one embodiment, processor 810 includes optical interface components in addition to a processor die. Thus, the processor die and photonic components are in the same package. Such a processor package can interface optically with an optical connector in accordance with any embodiment described herein.

The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features). In one embodiment, device 800 includes power management 850 that manages battery power usage, charging of the battery, and features related to power saving operation.

Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to memory device 862.

In one embodiment, memory subsystem 860 and memory device 862 implement I/O timing compensation based on feedback generated via periodic training Memory device 862 enters a training state, and memory controller 864 sends a training signal via the I/O interface between the memory device and the memory controller, which the memory device does not store in its memory array. In one embodiment, memory device 862 evaluates the received training signal for errors. In one embodiment, memory device 862 stores the training signal in a training buffer, which can be any buffer used to store the training signal, and memory controller 864 reads the buffered training signal, and evaluates the signal for errors. Based on detected errors, the system adjusts one or more I/O parameters of either the memory controller or the memory device or both to compensate for changes in environmental conditions that affect I/O timing.

Connectivity 870 includes hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audio-visual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a method for training input/output (I/O) settings for communication with a memory device includes entering, by a memory device, a training mode of the memory device; receiving a training signal from a controller while in the training mode; sampling the training signal with sampling circuitry; tracking, by the memory device, a number of errors in sampling the training signal; and causing an adjustment to at least one input/output (I/O) parameter based on the number of errors.

In one embodiment, entering the training mode comprises entering the training mode during a refresh mode of the memory device. In one embodiment, receiving the training signal comprises: receiving the training signal as a write command; and discarding the training signal instead of writing it to a memory array of the memory device. In one embodiment, tracking the number of errors comprises counting with a counter a number of errors that occur over a sequence of training signals. In one embodiment, causing the adjustment comprises sending the number of errors to the controller to cause the controller to determine the at least one I/O parameter to adjust. In one embodiment, causing the adjustment comprises causing the adjustment to a receive I/O parameter of the memory device. In one embodiment, causing the adjustment comprises causing the adjustment to a transmit I/O parameter of the controller. In one embodiment, causing the adjustment further comprises computing a search function to determine the at least one I/O parameter to adjust.

In one aspect, an article of manufacture comprising a computer readable storage medium having content stored thereon, which when executed performs operations including entering, by a memory device, a training mode of the memory device; receiving a training signal from a controller while in the training mode; sampling the training signal with sampling circuitry; tracking, by the memory device, a number of errors in sampling the training signal; and causing an adjustment to at least one input/output (I/O) parameter based on the number of errors.

In one embodiment, the content for entering the training mode comprises content for entering the training mode during a refresh mode of the memory device. In one embodiment, the content for receiving the training signal comprises content for receiving the training signal as a write command; and discarding the training signal instead of writing it to a memory array of the memory device. In one embodiment, the content for tracking the number of errors comprises content for counting with a counter a number of errors that occur over a sequence of training signals. In one embodiment, the content for causing the adjustment comprises content for sending the number of errors to the controller to cause the controller to determine the at least one I/O parameter to adjust. In one embodiment, the content for causing the adjustment comprises content for causing the adjustment to a receive I/O parameter of the memory device. In one embodiment, the content for causing the adjustment comprises content for causing the adjustment to a transmit I/O parameter of the controller. In one embodiment, the content for causing the adjustment further comprises content for computing a search function to determine the at least one I/O parameter to adjust.

In one aspect, an apparatus includes means for entering, by a memory device, a training mode of the memory device; means for receiving a training signal from a controller while in the training mode; means for sampling the training signal with sampling circuitry; means for tracking, by the memory device, a number of errors in sampling the training signal; and means for causing an adjustment to at least one input/output (I/O) parameter based on the number of errors.

In one embodiment, the means for entering the training mode comprises means for entering the training mode during a refresh mode of the memory device. In one embodiment, the means for receiving the training signal comprises means for receiving the training signal as a write command; and discarding the training signal instead of writing it to a memory array of the memory device. In one embodiment, the means for tracking the number of errors comprises means for counting with a counter a number of errors that occur over a sequence of training signals. In one embodiment, the means for causing the adjustment comprises means for sending the number of errors to the controller to cause the controller to determine the at least one I/O parameter to adjust. In one embodiment, the means for causing the adjustment comprises means for causing the adjustment to a receive I/O parameter of the memory device. In one embodiment, the means for causing the adjustment comprises means for causing the adjustment to a transmit I/O parameter of the controller. In one embodiment, the means for causing the adjustment further comprises means for computing a search function to determine the at least one I/O parameter to adjust.

In one aspect, a memory device with trainable input/output (I/O) settings includes a state controller to cause the memory device to enter a training mode of the memory device; a hardware contact to interface with a controller device, to receive a training signal from the controller while in the training mode; receiver hardware to sample the training signal and track a number of errors in sampling the training signal; and logic to cause an adjustment to at least one input/output (I/O) parameter based on the number of errors.

In one embodiment, the state controller is to cause the memory device to enter the training mode during a refresh mode of the memory device. In one embodiment, the receiver hardware is to discard the training signal instead of writing it to a memory array of the memory device. In one embodiment, the memory device further includes a counter to count a number of errors that occur over a sequence of training signals. In one embodiment, the logic is to cause an adjustment to at least one I/O parameter of a transmitter of the controller. In one embodiment, the logic further comprises search function logic to determine the at least one I/O parameter to adjust.

In one aspect, a method for training input/output (I/O) settings for communication with a memory device, includes sending a training signal as a write command to a memory device, where the memory device writes the training signal to a register but not to a memory array of the memory device; reading the training signal from the register; checking the read training signal for errors; and causing an adjustment to at least one input/output (I/O) parameter based on a number of errors.

In one embodiment, causing the adjustment comprises causing the adjustment to a receive I/O parameter of the memory device. In one embodiment, causing the adjustment comprises causing the adjustment to a transmit I/O parameter of the controller. In one embodiment, causing the adjustment further comprises computing a search function to determine the at least one I/O parameter to adjust. In one embodiment, the method further includes sending a command to cause the memory device to enter a training state while in the refresh state.

In one aspect, an article of manufacture comprising a computer readable storage medium having content stored thereon, which when executed performs operations including sending a training signal as a write command to a memory device, where the memory device writes the training signal to a register but not to a memory array of the memory device; reading the training signal from the register; checking the read training signal for errors; and causing an adjustment to at least one input/output (I/O) parameter based on a number of errors.

In one embodiment, the content for causing the adjustment comprises content for causing the adjustment to a receive I/O parameter of the memory device. In one embodiment, the content for causing the adjustment comprises content for causing the adjustment to a transmit I/O parameter of the controller. In one embodiment, the content for causing the adjustment further comprises content for computing a search function to determine the at least one I/O parameter to adjust. In one embodiment, the article of manufacture further includes content for sending a command to cause the memory device to enter a training state while in the refresh state.

In one aspect, an apparatus for training input/output (I/O) settings for communication with a memory device comprising: means for sending a training signal as a write command to a memory device, where the memory device writes the training signal to a register but not to a memory array of the memory device; means for reading the training signal from the register; means for checking the read training signal for errors; and means for causing an adjustment to at least one input/output (I/O) parameter based on a number of errors.

In one embodiment, the means for causing the adjustment comprises means for causing the adjustment to a receive I/O parameter of the memory device. In one embodiment, the means for causing the adjustment comprises means for causing the adjustment to a transmit I/O parameter of the controller. In one embodiment, the means for causing the adjustment further comprises means for computing a search function to determine the at least one I/O parameter to adjust. In one embodiment, the apparatus further includes means for sending a command to cause the memory device to enter a training state while in the refresh state.

In one aspect, a controller device for training input/output (I/O) settings for communication with a memory device comprising: a hardware contact to interface with a memory device, the controller device, via the hardware contact, to send a training signal as a write command to the memory device in a refresh state, where the memory device writes the training signal to a register but not to a memory array of the memory device; and read the training signal from the register; and logic to check the read training signal for errors and cause an adjustment to at least one input/output (I/O) parameter based on a number of errors.

In one embodiment, the logic is to cause an adjustment to at least one I/O parameter of the memory device. In one embodiment, the logic is to cause an adjustment to at least one I/O parameter of the controller.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
   entering, by a memory device, a training mode of the memory device;
   receiving a training signal from a controller while in the training mode, the training signal including a data stream;
   sampling the data stream of the training signal with sampling circuitry;
   tracking, by the memory device, a number of data errors in the sampling of the data stream of the training signal; and
   causing an adjustment to at least one input/output (I/O) parameter based on the number of data errors.

2. The method of claim 1, wherein entering the training mode comprises entering the training mode during a refresh mode of the memory device.

3. The method of claim 1, wherein receiving the training signal comprises:
   receiving the training signal as a write command; and discarding the training signal instead of writing it to a memory array of the memory device.

4. The method of claim 1, wherein tracking the number of errors comprises:
counting with a counter a number of errors that occur over a sequence of training signals.

5. The method of claim 3, wherein causing the adjustment comprises:
sending the number of errors to the controller to cause the controller to determine the at least one I/O parameter to adjust.

6. The method of claim 1, wherein causing the adjustment comprises:
causing the adjustment to a receive I/O parameter of the memory device.

7. The method of claim 1, wherein causing the adjustment comprises:
causing the adjustment to a transmit I/O parameter of the controller.

8. The method of claim 1, wherein causing the adjustment further comprises:
computing a search function to determine the at least one I/O parameter to adjust.

9. A memory device comprising:
a state controller to cause the memory device to enter a training mode of the memory device;
a hardware contact to interface with a controller device, to receive a training signal from the controller while in the training mode, the training signal including a data stream;
receiver hardware to sample the data stream of the training signal and track a number of data errors in the sampling of the data stream of the training signal; and
logic to cause an adjustment to at least one input/output (I/O) parameter based on the number of data errors.

10. The memory device of claim 9, wherein the state controller is to cause the memory device to enter the training mode during a refresh mode of the memory device.

11. The memory device of claim 9, wherein the receiver hardware is to discard the training signal instead of writing it to a memory array of the memory device.

12. The memory device of claim 9, further comprising:
a counter to count a number of errors that occur over a sequence of training signals.

13. The memory device of claim 9, wherein the logic is to cause an adjustment to at least one I/O parameter of a transmitter of the controller.

14. The memory device of claim 9, wherein the logic further comprises:
search function logic to determine the at least one I/O parameter to adjust.

15. A method comprising:
sending a training signal as a write command to a memory device, where the memory device writes the training signal to a register but not to a memory array of the memory device, the training signal including a plurality of data values;
reading the training signal from the register;
checking the read training signal for errors in the plurality of data values; and
causing an adjustment to an input/output (I/O) parameter of the memory device based on a number of errors in the plurality of data errors.

16. The method of claim 15, wherein causing the adjustment comprises:
causing the adjustment to a transmit I/O parameter of the controller.

17. The method of claim 15, wherein causing the adjustment further comprises:
computing a search function to determine the at least one I/O parameter to adjust.

18. The method of claim 15, further comprising:
sending a command to cause the memory device to enter a training state while in the refresh state.

19. A controller device comprising:
a hardware contact to interface with a memory device, the controller device, via the hardware contact, to send a training signal as a write command to the memory device in a refresh state, the training signal including a plurality of data values, where the memory device is to write the training signal including the plurality of data values to a register but not to a memory array of the memory device; and
read the training signal including the plurality of data values from the register; and
logic to check the read training signal for errors in the plurality of data values and cause an adjustment to at least one input/output (I/O) parameter of the memory device based on a number of errors in the plurality of data values.

20. The controller device of claim 19, wherein the logic is to cause an adjustment to at least one I/O parameter of the controller.

* * * * *